(12) United States Patent
Asao

(10) Patent No.: US 7,579,614 B2
(45) Date of Patent: Aug. 25, 2009

(54) MAGNETIC RANDOM ACCESS MEMORY

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 11/833,504

(22) Filed: Aug. 3, 2007

(65) Prior Publication Data
US 2008/0035958 A1 Feb. 14, 2008

(30) Foreign Application Priority Data
Aug. 9, 2006 (JP) ............... 2006-217322

(51) Int. Cl.
*H01L 27/088* (2006.01)
(52) U.S. Cl. ............... 257/4; 257/5; 257/295; 257/379; 257/E21.665
(58) Field of Classification Search ............ 257/4, 257/5, 295, 379, 421, 904, E45.002, E21.665; 365/158, 171, 173; 360/324, 324.2, 324.12
See application file for complete search history.

(56) References Cited

U.S. PATENT DOCUMENTS 6,795,334 B2 9/2004 Iwata et al.
7,138,685 B2 * 11/2006 Hsu et al. ............... 257/368
2004/0061156 A1 * 4/2004 Cha .......................... 257/295
2004/0175887 A1 * 9/2004 Cha .......................... 438/257

OTHER PUBLICATIONS

Roy Scheuerlein, et al., "A 10ns Read and Write Non-Volatile Memory Array Using a Magnetic Tunnel Junction and FET Switch in each Cell", IEEE International Solid-State Circuits Conference 2000/Session 7/TD: Emerging Memory & Device Technologies/paper TA 7.2, Digest of Technical Papers, Feb. 8, 2000, pp. 128-129.

* cited by examiner

*Primary Examiner*—Minh-Loan T Tran
*Assistant Examiner*—Vongsavanh Sengdara
(74) *Attorney, Agent, or Firm*—Oblon, Spivak, McClelland, Maier & Neustadt, P.C.

(57) ABSTRACT

A magnetic random access memory includes a semiconductor substrate having a projection projecting from a substrate surface, first and second gate electrodes and a first source diffusion layer formed on first and second side surfaces and an upper surface of the projection, first and second drain diffusion layers formed in the substrate surface at roots on the first and second side surfaces of the first projection, first and second word lines formed above the semiconductor substrate, a bit line formed above the first and second word lines, a first magnetoresistive effect element formed between the bit line and the first word line, a second magnetoresistive effect element formed between the bit line and the second word line, a first contact which connects the first magnetoresistive effect element and the first drain diffusion layer, and a second contact which connects the second magnetoresistive effect element and the second drain diffusion layer.

20 Claims, 11 Drawing Sheets

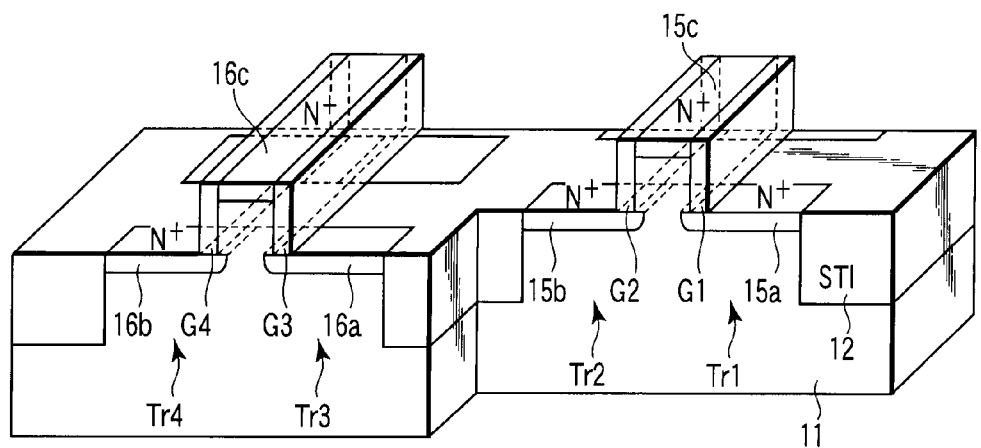
F I G. 5
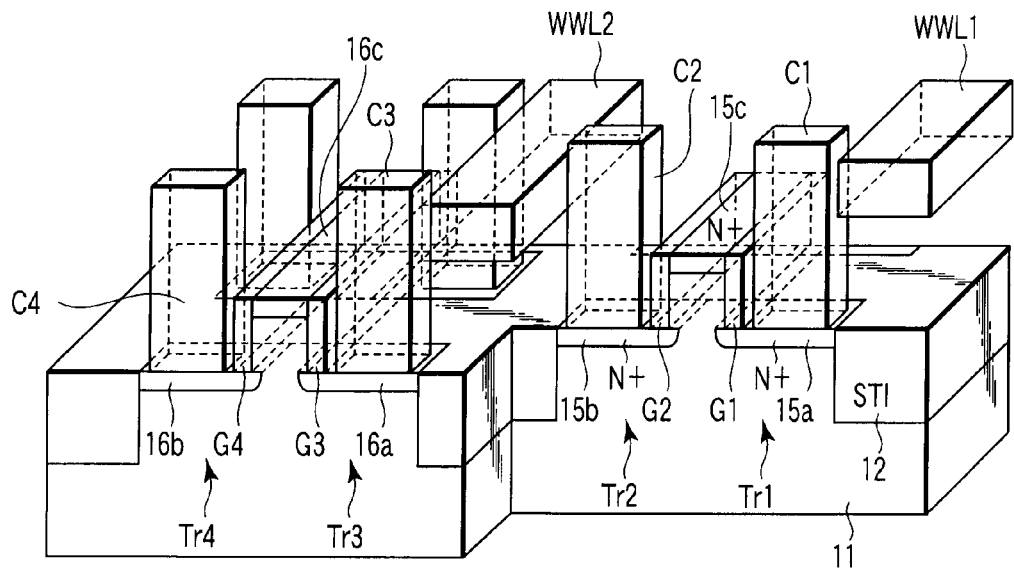
F I G. 6

MAGNETIC RANDOM ACCESS MEMORY

CROSS-REFERENCE TO RELATED APPLICATIONS

This application is based upon and claims the benefit of priority from prior Japanese Patent Application No. 2006-217322, filed Aug. 9, 2006, the entire contents of which are incorporated herein by reference.

BACKGROUND OF THE INVENTION

1. Field of the Invention

The present invention relates to a magnetic random access memory (MRAM) using the magnetoresistive effect.

2. Description of the Related Art

Recently, many memories that store information by using new principles have been proposed. One of these memories is a magnetic random access memory using the tunneling magnetoresistive effect. An example is disclosed in Roy Scheuerlein et. al., ISSCC2000 Technical Digest p. 128, "A 10 ns Read and Write Non-Volatile Memory Array Using a Magnetic Tunnel Junction and FET Switch in each Cell".

The magnetic random access memory stores information "1" and "0" in MTJ (Magnetic Tunnel Junction) elements. These MTJ elements are arranged at the intersections of write word lines and data select lines (bit lines) intersecting each other. Switching elements are connected in series with the MTJ elements.

In this magnetic random access memory as described above, data is written by supplying electric currents to a write word line and data select line, and making the spin directions parallel or antiparallel in an MTJ element by using a magnetic field generated by the electric currents flowing through the two lines. On the other hand, data is read out by forming a current path by turning on a selected switching element, thereby supplying an electric current to only a selected MTJ element and detecting the resistance value of this MTJ element.

Conventionally, letting F (Feature size) and 2F be the short-side size and long-side size, respectively, of the MTJ element, the cell size when a MOSFET is used as the switching element is $12F^2$. This makes the cell size of the magnetic random access memory larger than those of a DRAM and flash memory.

BRIEF SUMMARY OF THE INVENTION

A magnetic random access memory according to the aspect of the present invention comprises a semiconductor substrate having a first projection projecting from a substrate surface, the first projection having an upper surface, a first side surface and a second side surface opposing each other, a first gate electrode formed on the first side surface of the first projection, a second gate electrode formed on the second side surface of the first projection, a first source diffusion layer formed in the upper surface of the first projection, first drain diffusion layer formed in the substrate surface at a root on a side of the first side surface of the first projection, a second drain diffusion layer formed in the substrate surface at a root on a side of the second side surface of the first projection, a first word line formed above the semiconductor substrate, a second word line formed above the semiconductor substrate, a first bit line formed above the first word line and the second word line, a first magnetoresistive effect element formed between the first bit line and the first word line, and connected to the first bit line, a second magnetoresistive effect element formed between the first bit line and the second word line, and connected to the first bit line, a first contact which connects the first magnetoresistive effect element and the first drain diffusion layer, and a second contact which connects the second magnetoresistive effect element and the second drain diffusion layer.

BRIEF DESCRIPTION OF THE SEVERAL VIEWS OF THE DRAWING

FIGS. 3 to 8 are perspective views showing steps in fabricating the magnetic random access memory according to the first embodiment of the present invention;

DETAILED DESCRIPTION OF THE INVENTION

Figure 1:
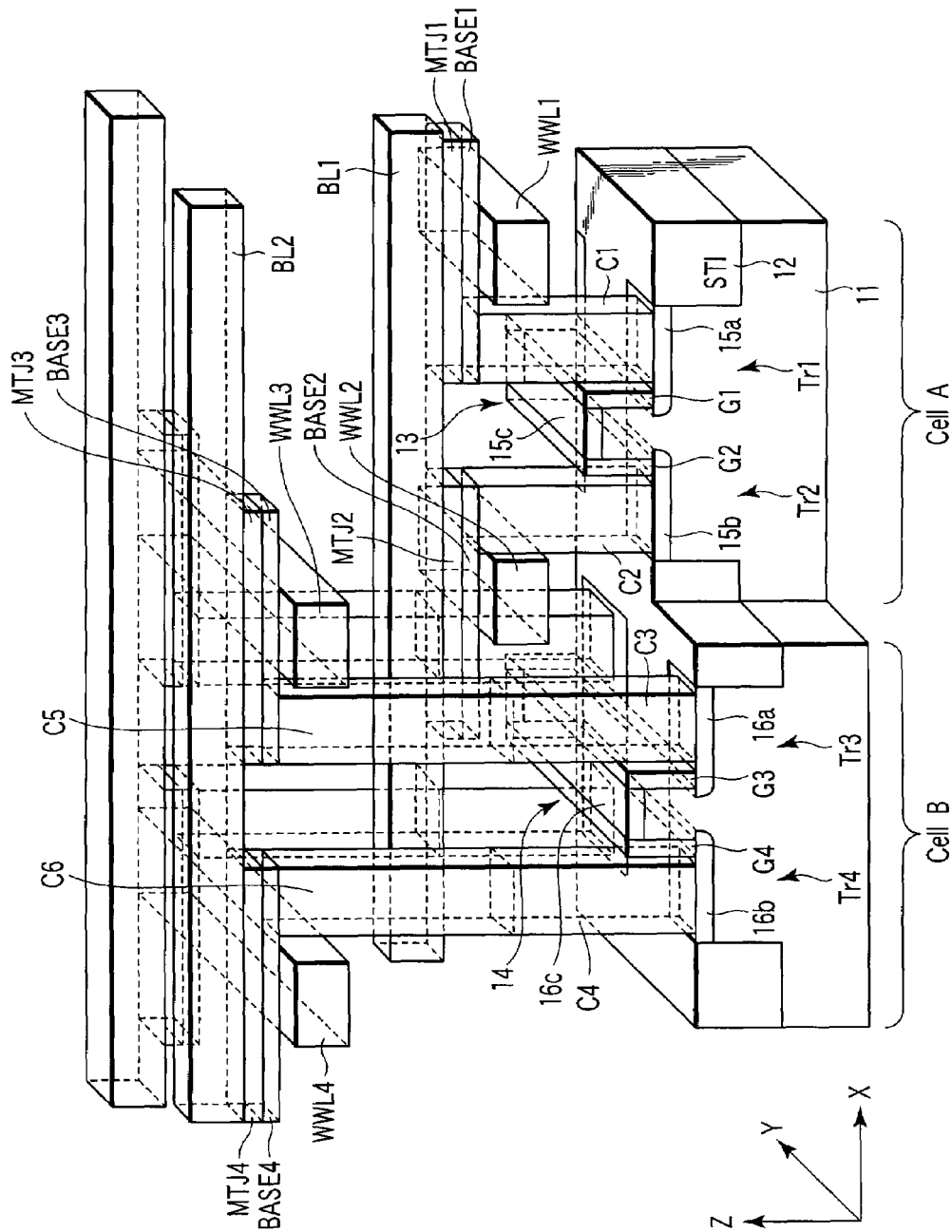
FIG. 1 is a perspective view showing a magnetic random access memory according to the first embodiment of the present invention.

Embodiments of the present invention will be explained below with reference to the accompanying drawings. In the following explanation, the same reference numerals denote the same parts throughout the drawing.

FIRST EMBODIMENT

Figure 2:
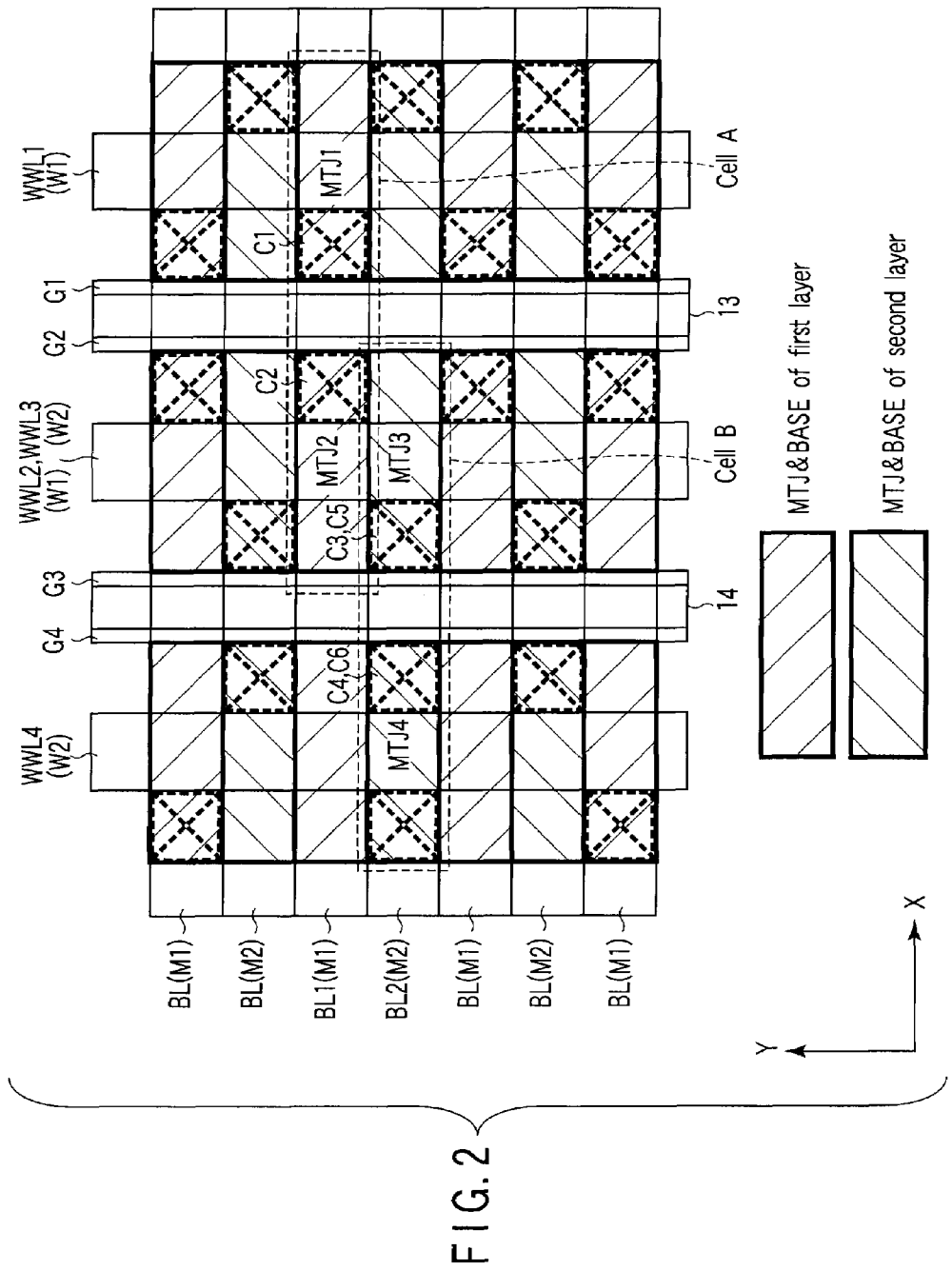
FIG. 2 is a plan view showing the magnetic random access memory according to the first embodiment of the present invention.

FIG. 1 is a perspective view of a magnetic random access memory (MRAM) according to the first embodiment of the present invention. FIG. 2 is a plan view of the magnetic random access memory according to the first embodiment of the present invention. The magnetic random access memory according to the first embodiment will be explained below.

As shown in FIG. 1, a silicon substrate (semiconductor substrate) 11 has first and second projections (silicon pillars) 13 and 14 projecting from the substrate surface. The first and second projections 13 and 14 each have two side surfaces opposing each other in the X direction, and an upper surface higher than the substrate surface. The first and second projections 13 and 14 extend in the Y direction over element regions adjacent to each other in the Y direction.

Gate electrodes G1 and G2 are respectively formed on the two opposing side surfaces of the first projection 13. A source diffusion layer 15c is formed in the upper surface of the first projection 13. Drain diffusion layers 15a and 15b are formed in the substrate surface at the root of the first projection 13. Accordingly, the first projection 13 has two vertical transistors (e.g., MOSFETs) Tr1 and Tr2 sharing the source diffusion layer 15c. In the vertical transistors Tr1 and Tr2, those two side surfaces of the first projection 13 which oppose each other in the X direction function as channel regions. The source diffusion layer 15c is connected to, e.g., a ground terminal.

Write word lines WWL1 and WWL2 running in the Y direction are arranged above the silicon substrate 11 on the two sides of the first projection 13. The write word lines WWL1 and WWL2 are formed on the same layer level. A bit line BL1 running in the X direction is formed above the write word lines WWL1 and WWL2.

An MTJ (Magnetic Tunnel Junction) element MTJ1 is formed between the bit line BL1 and write word line WWL1, and connected to the bit line BL1. An MTJ element MTJ2 is formed between the bit line BL1 and write word line WWL2, and connected to the bit line BL1. The easy magnetization axis of the MTJ elements MTJ1 and MTJ2 points in the X direction. The hard magnetization axis of the MTJ elements MTJ1 and MTJ2 points in the Y direction.

Lower electrodes BASE1 and BASE2 are respectively formed below the MTJ elements MTJ1 and MTJ2. The lower electrodes BASE1 and BASE2 respectively have the same planar shapes as the MTJ elements MTJ1 and MTJ2. Contacts C1 and C2 are respectively arranged below the lower electrodes BASE1 and BASE2. The contact C1 connects the lower electrode BASE1 and drain diffusion layer 15a, thereby connecting the MTJ element MTJ1 and vertical transistor Tr1 in series. The contact C2 connects the lower electrode BASE2 and drain diffusion layer 15b, thereby connecting the MTJ element MTJ2 and vertical transistor Tr2 in series.

A cell B having the second projection 14 has an arrangement similar to that of a cell A having the first projection 13 described above, and hence will be briefly explained. Gate electrodes G3 and G4 are formed on the side surfaces of the second projection 14. A source diffusion layer 16c is formed in the upper surface of the second projection 14. Drain diffusion layers 16a and 16b are formed in the substrate surface at the root of the second projection 14. In this manner, two vertical transistors Tr3 and Tr4 sharing the source diffusion layer 16c are formed. An MTJ element MTJ3 and lower electrode BASE3 are arranged between a bit line BL2 and write word line WWL3. An MTJ element MTJ4 and lower electrode BASE4 are arranged between the bit line BL2 and a write word line WWL4. The MTJ elements MTJ3 and MTJ4 are connected to the bit line BL2. Contacts C3 and C5 are arranged below the lower electrode BASE3, and connected to the drain diffusion layer 16a. Contacts C4 and C6 are arranged below the lower electrode BASE4, and connected to the drain diffusion layer 16b.

The difference of the cell B having the above arrangement from the cell A is that the MTJ elements MTJ3 and MTJ4 are formed on a layer level different from the MTJ elements MTJ1 and MTJ2. That is, the write word lines WWL3 and WWL4 in the cell B are arranged on an upper layer level of the bit line BL1 in the cell A, and the bit line BL2 is formed on an upper layer level of the write word lines WWL3 and WWL4. Accordingly, the MTJ elements MTJ3 and MTJ4 in the cell B are arranged on an upper layer level of the MTJ elements MTJ1 and MTJ2 in the cell A. Note that each of the cells A and B comprises two cells sharing the source diffusion layer of the vertical transistors.

Although FIG. 1 shows a portion of the memory cell array region of the magnetic random access memory, the whole array has the following arrangement because the cells A and B are alternately arranged in the X direction.

Assume that the position of the write word lines WWL1 and WWL2 in the cell A is a layer level W1, and the position of the write word lines WWL3 and WWL4 in the cell B is a layer level W2. In this case, two write word lines on the layer level W1 and two write word lines on the layer level W2 are alternately arranged in the X direction. As shown in FIG. 2, the write word line WWL2 in the cell A and the write word line WWL3 in the cell B overlap each other on the different layer levels W1 and W2. The contacts C2 and C3 sandwich the write word line WWL2.

Assume also that the position of the bit line BL1 in the cell A is a layer level M1, and the position of the bit line BL2 in the cell B is a layer level M2. In this case, a bit line on the layer level M1 and a bit line on the layer level M2 are alternately arranged in the Y direction. As shown in FIG. 2, a bit line BL on the layer level M1 and a bit line BL on the layer level M2 can be arranged with no spacing between them in the Y direction when the memory is viewed from its upper surface, because no short circuit occurs between different layer levels.

As shown in FIG. 2, the MTJ element MTJ2 in the cell A, which is close to the cell B, and the MTJ element MTJ3 in the cell B, which is close to the cell A, are arranged between the first and second projections 13 and 14. The MTJ element MTJ2 in the cell A, which is close to the cell B, and the MTJ element MTJ3 in the cell B, which is close to the cell A, do not overlap each other when the memory is viewed from its upper surface.

Note that the MTJ element has a fixed layer in which magnetization is fixed in one axial direction, a recording layer in which magnetization reverses, and a nonmagnetic layer sandwiched between the fixed layer and recording layer. Each of the fixed layer and recording layer may also be a layered film including a plurality of ferromagnetic layers. At least one of the fixed layer and recording layer may also have an antiferromagnetic coupling structure which includes three layers, i.e., a first ferromagnetic layer, nonmagnetic layer, and second ferromagnetic layer, and in which the first and second ferromagnetic layers magnetically couple with each other (by interlayer exchange coupling) such that the magnetization directions in these layers are antiparallel, or a ferromagnetic coupling structure in which the first and second ferromagnetic layers magnetically couple with each other such that the magnetization directions in these layers are parallel. The MTJ element may have a single-junction structure including one nonmagnetic layer, or a double-junction structure including two nonmagnetic layers. The planar shape of the MTJ element is not limited to a rectangle, and can also be, e.g., an ellipse, circle, hexagon, rhombus, parallelogram, cross, or bean (recessed shape). The MTJ element can be a parallel magnetization type element in which the magnetization direction is parallel to the film surface, or a perpendicular magnetization type element in which the magnetization direction is perpendicular to the film surface.

FIGS. 3 to 8 are perspective views of steps in fabricating the magnetic random access memory according to the first embodiment of the present invention. A method of fabricating the magnetic random access memory according to the first embodiment will be explained below.

Figure 3:
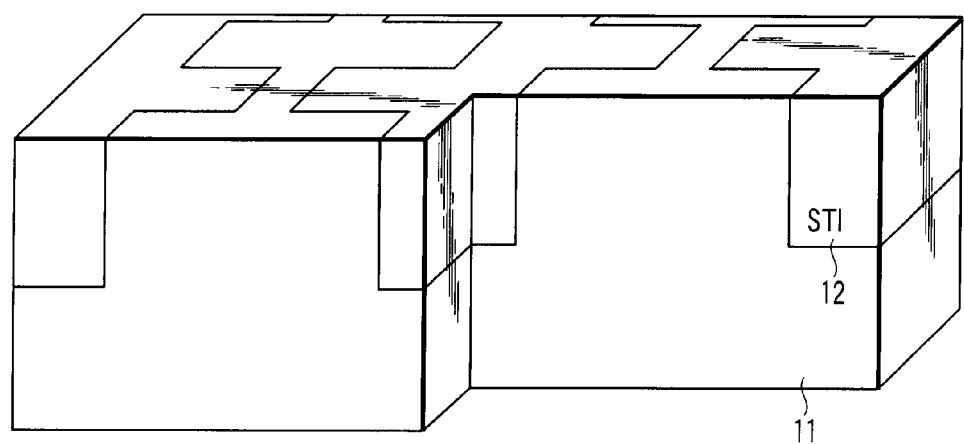

First, as shown in FIG. 3, a trench is formed in, e.g., a P-type silicon substrate 11, and an insulating film is buried in this trench, thereby forming an element isolation region 12 having an STI (Shallow Trench Isolation) structure.

Figure 4:
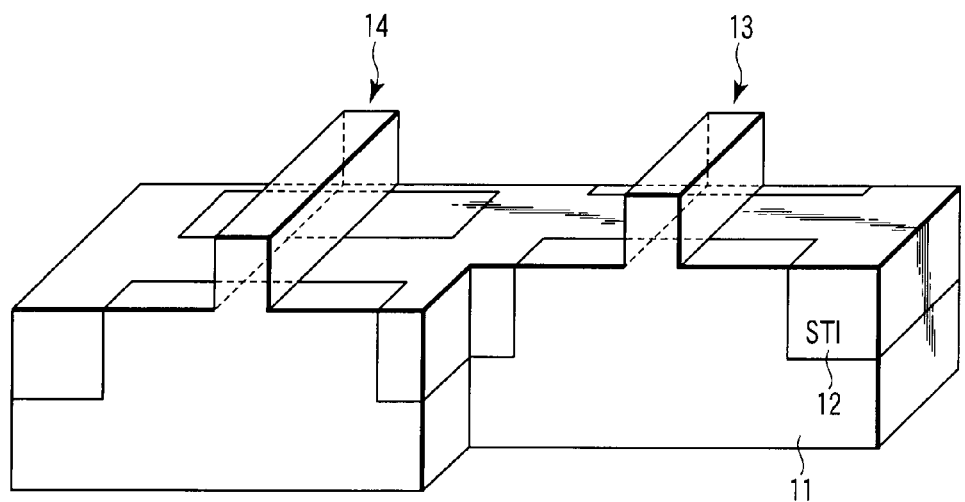

Then, as shown in FIG. 4, the silicon substrate 11 is patterned into a projecting shape by lithography and RIE (Reactive Ion Etching), forming projections 13 and 14 in element regions. The projections 13 and 14 function as channel regions of vertical transistors Tr1, Tr2, Tr3, and Tr4.

As shown in FIG. 5, an electrode material made of, e.g., polysilicon is deposited by CVD (Chemical Vapor Deposition) and removed so as to remain on only the side surfaces of the projections 13 and 14, thereby forming gate electrodes G1, G2, G3, and G4 on the side surfaces of the projections 13 and 14. Note that gate insulating films (not shown) are formed between the side surfaces of the projections 13 and 14 and the gate electrodes G1, G2, G3, and G4. Subsequently, ion implantation is performed to form source/drain diffusion layers 15a, 15b, 15c, 16a, 16b, and 16c made of, e.g., N+ layers. More specifically, the source diffusion layers 15c and 16c are formed in the upper surfaces of the projections 13 and 14, and the drain diffusion layers 15a, 15b, 16a, and 16b are formed in the silicon substrate 11 at the roots of the projections 13 and 14. In this manner, vertical transistors Tr1, Tr2, Tr3, and Tr4 are formed.

As shown in FIG. 6, lower layers of contacts C1, C2, C3, and C4 made of, e.g., tungsten are formed on the source/drain diffusion layers 15a, 15b, 15c, 16a, 16b, and 16c in the same manner as in the conventional MRAM process. The damascene method is then used to form write word lines WWL1 and WWL2 made of, e.g., Cu. After that, upper layers of the contacts C1, C2, C3, and C4 made of, e.g., tungsten are formed.

Figure 7:
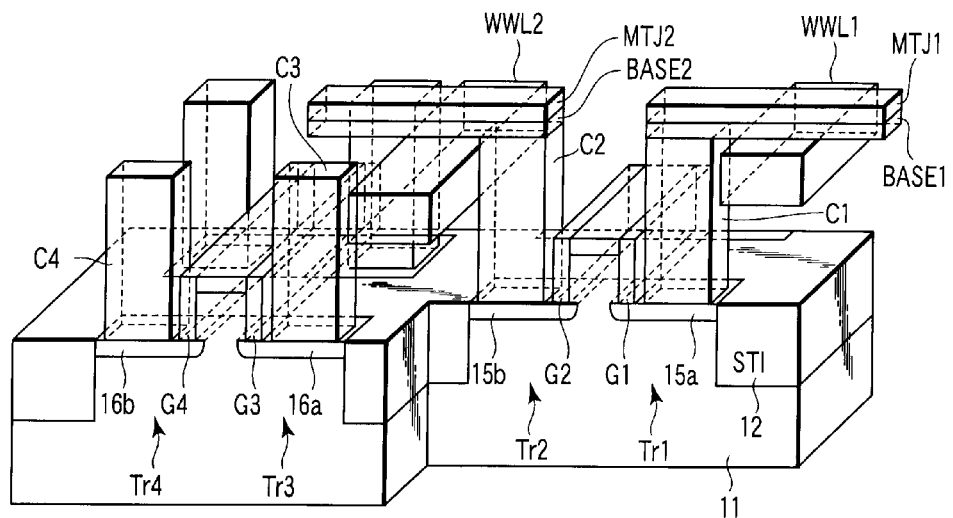

As shown in FIG. 7, lower electrodes BASE1 and BASE2 made of, e.g., Ta are formed by sputtering. MTJ element films are formed on the lower electrodes BASE1 and BASE2 by sputtering. These MTJ element films are processed by the photoresist technique to form MTJ elements MTJ1 and MTJ2 having desired patterns.

Figure 8:
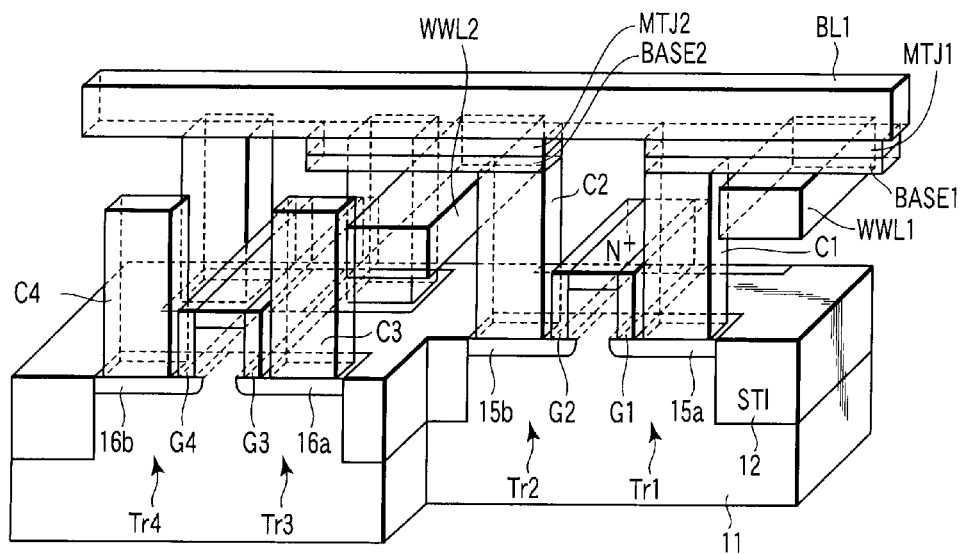

As shown in FIG. 8, a bit line BL1 made of, e.g., Cu is formed on the MTJ elements MTJ1 and MTJ2 such that the bit line BL1 and the MTJ elements MTJ1 and MTJ2 are in direct contact with each other so as to form electrical contacts. In this way, a cell A as the first layer is completed.

Then, as shown in FIG. 1, a cell B as the second layer is formed in the same manner as for the first layer. That is, contacts C5 and C6 to be connected to the contacts C3 and C4 and write word lines WWL3 and WWL4 are formed above the vertical transistors Tr3 and Tr4. After lower electrodes BASE3 and BASE4 and MTJ elements MTJ3 and MTJ4 are formed, a bit line BL2 is formed. In this manner, the cell B as the second layer is completed.

The first embodiment described above forms the vertical transistors Tr1 and Tr2 as read switching elements by forming the gate electrodes G1 and G2 on the two side surfaces of the projection 13 of the silicon substrate 11. Since the two vertical transistors Tr1 and Tr2 occupy only about the area of one ordinary transistor, the area occupied by the transistors can be reduced compared to the conventional devices.

Also, the layer level of the MTJ elements MTJ1 and MTJ2 in the cell A and that of the MTJ elements MTJ3 and MTJ4 in the cell B are different. This makes it possible to eliminate the spaces in the X and Y directions between the cells A and B in the boundary between them, thereby reducing the cell area.

As described above, the first embodiment can achieve a cell size of $2F \times 2F = 4F^2$ where F (Feature size) is the short side (the width in the hard magnetization axis direction) and 2F is the long side (the width in the easy magnetization axis direction) of the MTJ element, and can reduce the cell area compared to the conventional devices.

SECOND EMBODIMENT

The second embodiment will be explained with reference to an example in which the problem of short circuits is solved by partially thickening gate insulating films, and the resistance is decreased by forming silicide films.

FIGS. 9 to 13 are sectional views of steps in fabricating a magnetic random access memory according to the second embodiment of the present invention. A method of fabricating the magnetic random access memory according to the second embodiment will be explained below.

Figure 9:
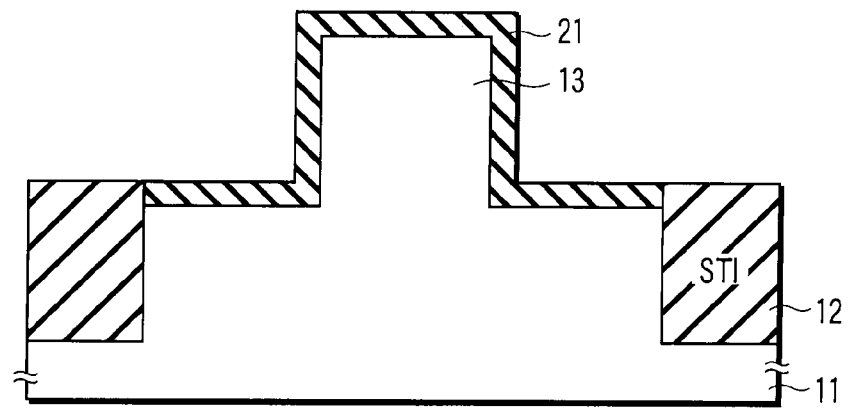
FIGS. 9 to 13 are sectional views showing steps in fabricating a magnetic random access memory according to the second embodiment of the present invention.

First, as shown in FIG. 9, element isolation regions 12 are formed in, e.g., a P-type silicon substrate 11, and a projection 13 is formed. After that, a gate insulating film 21 made of, e.g., a silicon oxide film is formed on an element region.

Figure 10:
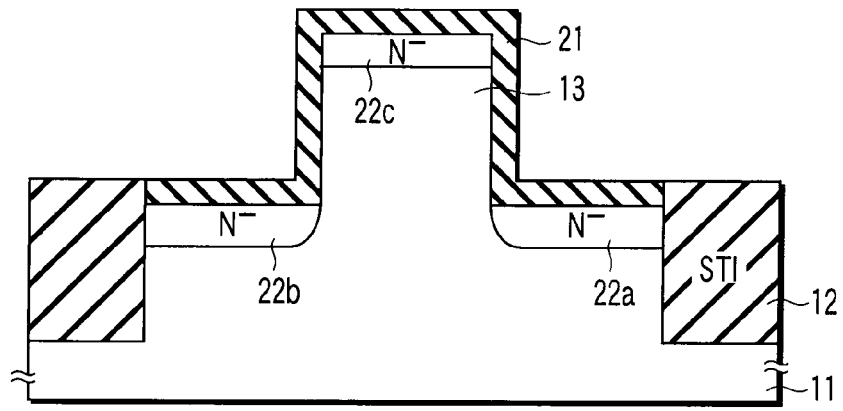

Then, as shown in FIG. 10, lightly doped source/drain diffusion layers 22a, 22b, and 22c made of, e.g., N− layers are formed by ion implantation. More specifically, the source diffusion layer 22c is formed in the upper surface of the projection 13, and the drain diffusion layers 22a and 22b are formed in the silicon substrate 11 at the root of the projection 13.

Figure 11:
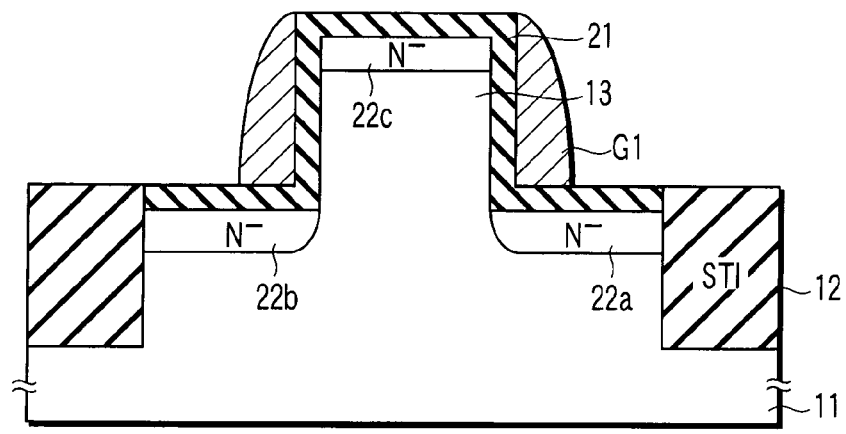

As shown in FIG. 11, an electrode material made of, e.g., polysilicon is deposited by CVD and removed so as to remain on only the side surfaces of the projection 13, thereby forming gate electrodes G1 and G2 on the side surfaces of the projection 13.

Figure 12:
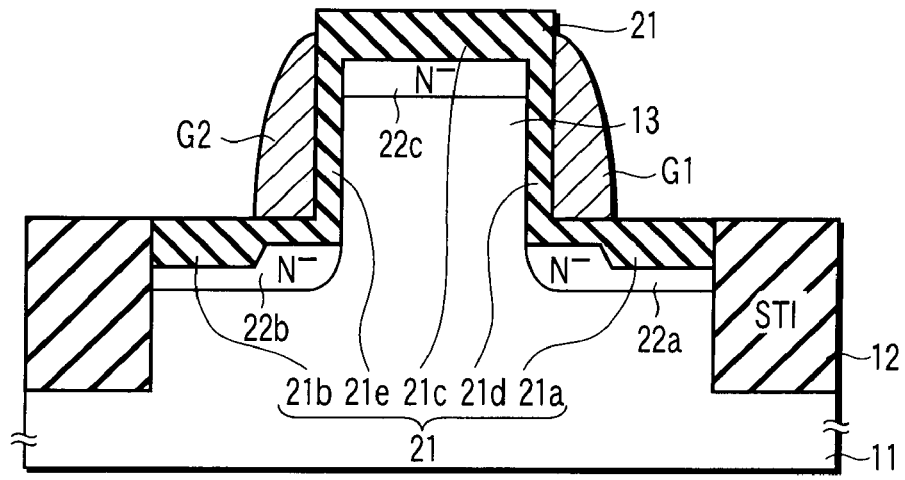

Subsequently, as shown in FIG. 12, the gate insulating film 21 in portions not covered with the gate electrodes G1 and G2 is oxidized by post-oxidation. This makes gate insulating films 21a, 21b, and 21c on the source/drain diffusion layers 22a, 22b, and 22c thicker than gate insulating films 21d and 21e on the side surfaces of the projection 13. One continuous film 21 forms the gate insulating films 21a, 21b, 21c, 21d, and 21e.

Figure 13:
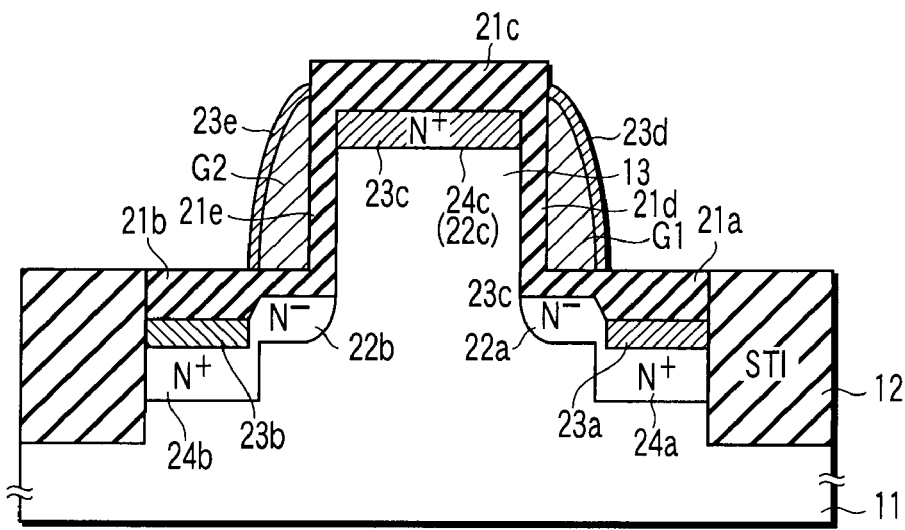

As shown in FIG. 13, silicide films 23a, 23b, 23c, 23d, and 23e made of Co or the like are formed on the source/drain diffusion layers 22a, 22b, and 22c and gate electrodes G1 and G2. In addition, As or P is ion-implanted to form heavily doped source/drain diffusion layers 24a, 24b, and 24c made of N+ layers. In this manner, the source/drain diffusion layers having an LDD (Lightly Doped Drain) structure are formed.

The second embodiment described above can achieve not only the same effects as in the first embodiment but also the following effects.

The resistance can be decreased by forming the silicide films 23a, 23b, 23c, 23d, and 23e on the source/drain diffusion layers 24a, 24b, and 24c and gate electrodes G1 and G2.

Also, the post-oxidation thickens the gate insulating film 21 in the portions not covered with the gate electrodes G1 and G2. This makes it possible to suppress short circuits between the gate electrode G1 and the source/drain diffusion layers 24a and 24c, and between the gate electrode G2 and the source/drain diffusion layers 24b and 24c.

THIRD EMBODIMENT

The third embodiment will be explained with reference to an example of the arrangement of contacts connected to gate electrodes and contacts connected to source diffusion layers.

Figure 14:
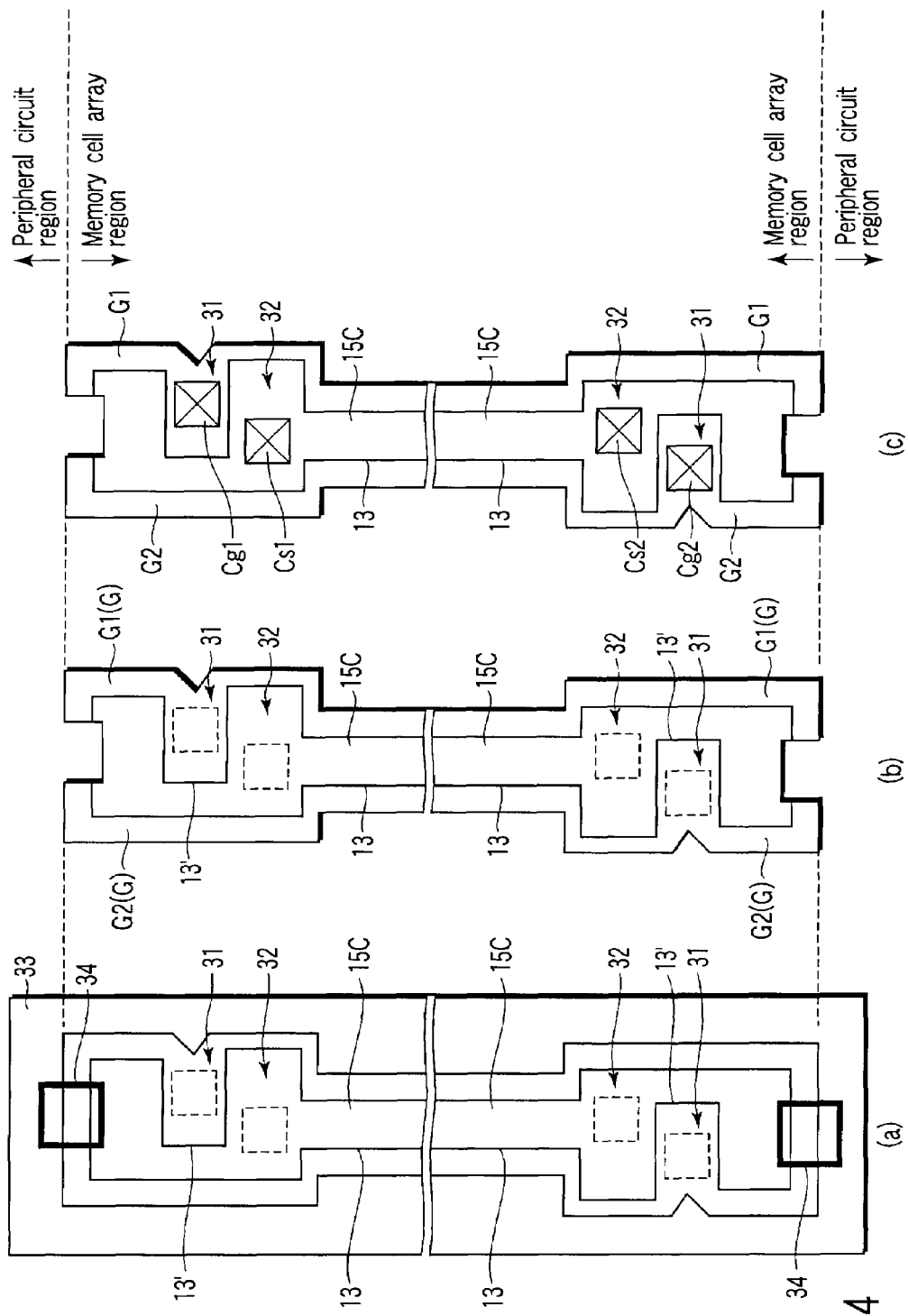
FIG. 14 is a plan view showing a magnetic random access memory according to the third embodiment of the present invention.
Figure 15:
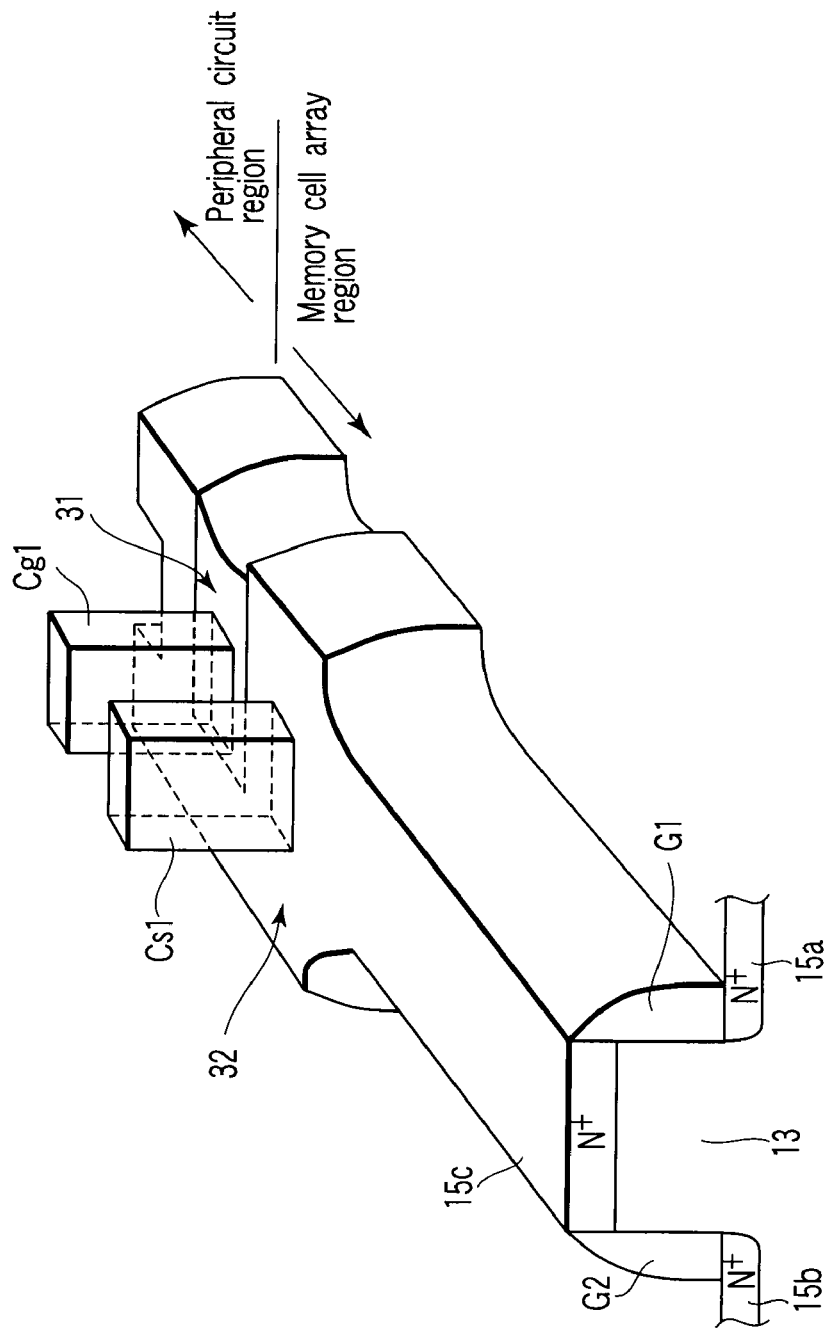
FIG. 15 is a perspective view showing the magnetic random access memory according to the third embodiment of the present invention.

FIGS. 14A to 14C are plan views of a magnetic random access memory according to the third embodiment of the present invention. FIG. 15 is a perspective view of the magnetic random access memory according to the third embodiment of the present invention. The magnetic random access memory according to the third embodiment will be explained below.

As shown in FIG. 14A, the end portions of a memory cell array region have regions where the width of a projection 13 is larger than that of the central portion. These regions are source contact regions 32. Also, recesses 13' are formed in the projection 13 at the end portions of the memory cell array region. The recesses 13' form gate contact regions 31. A gate electrode material G is formed around the projection 13 and buried in the recesses 13' of the projection 13. A resist 33 is formed on the entire surface, and openings 34 are formed in the resist 33 by lithography and etching. The gate electrode material G is partially etched away from the openings 34 of the resist 33. Consequently, as shown in FIG. 14B, the gate electrode material G is separated at the end portions of the memory cell array region, thereby forming gate electrodes G1 and G2. After that, as shown in FIGS. 14C and 15, contacts Cg1 and Cg2 are formed in the gate contact regions 31, and contacts Cs1 and Cs2 are formed in the source contact regions 32. The contacts Cs1 and Cs2 are connected to, e.g., ground terminals.

In this arrangement, as shown in FIG. 14C, the contacts Cg1 and Cg2 connected to the gate electrodes G1 and G2 and the contacts Cs1 and Cs2 connected to a source diffusion layer 15c are formed at the two end portions of the memory cell array region. The contact Cg1 of the gate electrode G1 and the contact Cg2 of the gate electrode G2 are desirably formed not at the same end portion but at different end portions of the memory cell array region.

The third embodiment can achieve the same effects as in the first embodiment. In addition, the third embodiment forms the contact Cg1 connected to the gate electrode G1 and the contact Cs1 connected to the source diffusion layer 15c at one end portion of the memory cell array region, and forms the contact Cg2 connected to the gate electrode G2 and the contact Cs2 connected to the source diffusion layer 15c at the other end portion of the memory cell array region. Accordingly, the contacts Cg1 and Cg2 can be connected to the gate electrodes G1 and G2 at different end portions of the memory cell array region. Since the contacts Cg1, Cg2, Cs1, and Cs2 are thus formed by using the regions at the two end portions of the memory cell array region, the cell area can be reduced compared to the case that the region at one end portion of the memory cell array region is used.

FOURTH EMBODIMENT

The fourth embodiment will explain the relationship between the width and impurity concentration of a projection of a silicon substrate.

Figure 16:
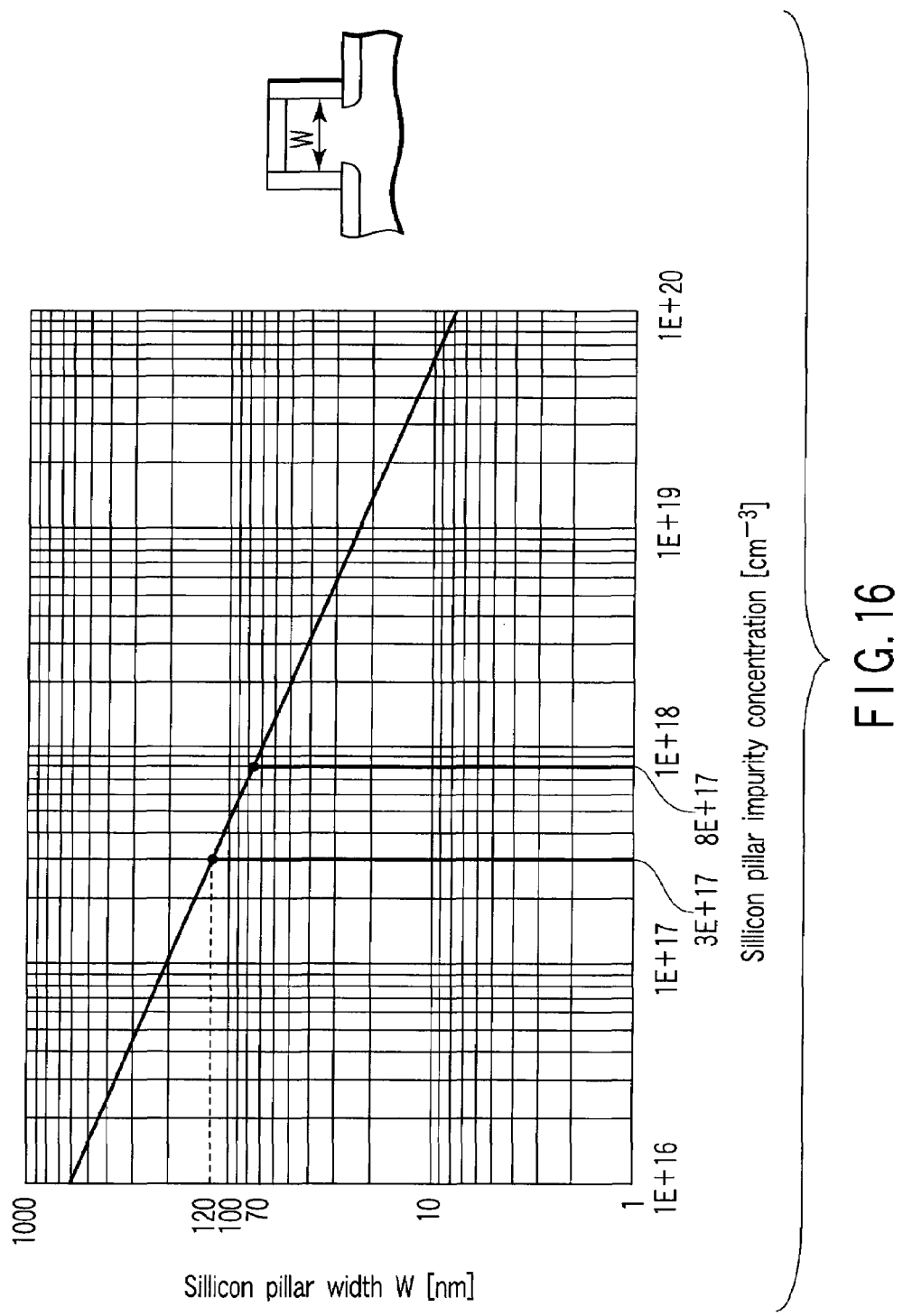
FIG. 16 is a graph showing the relationship between the width and impurity concentration of a projection according to the fourth embodiment of the present invention.

FIG. 16 is a graph showing the relationship between the width and impurity concentration of a projection according to the fourth embodiment of the present invention. The projection can be depleted by setting its impurity concentration to the left side of the straight line in FIG. 16. For example, when a width W of the projection is 100 nm, the impurity concentration is desirably 4E+17 to 5E+17 cm$^{-3}$.

When the operation of a magnetic random access memory cell is taken into consideration, the width W of the projection is desirably 70 nm$\leq$W$\leq$120 nm. The upper limit is thus defined because the short-channel effect can be suppressed by setting the impurity concentration of the projection to about 3E+17 cm$^{-3}$ or more. The lower limit is thus defined because junction leakage can be suppressed by setting the impurity concentration of the projection to about 8E+17 cm$^{-3}$ or less.

The fourth embodiment described above can achieve the same effects as in the first embodiment. In addition, the fourth embodiment can deplete the projection and improve the subthreshold characteristics by setting the width W and impurity concentration of the projection so as to satisfy the relationship shown in FIG. 16.

Note that the present invention is not limited to the above embodiments, and can be variously modified when practiced without departing from the spirit and scope of the invention. Examples are as follows.

Figure 17:
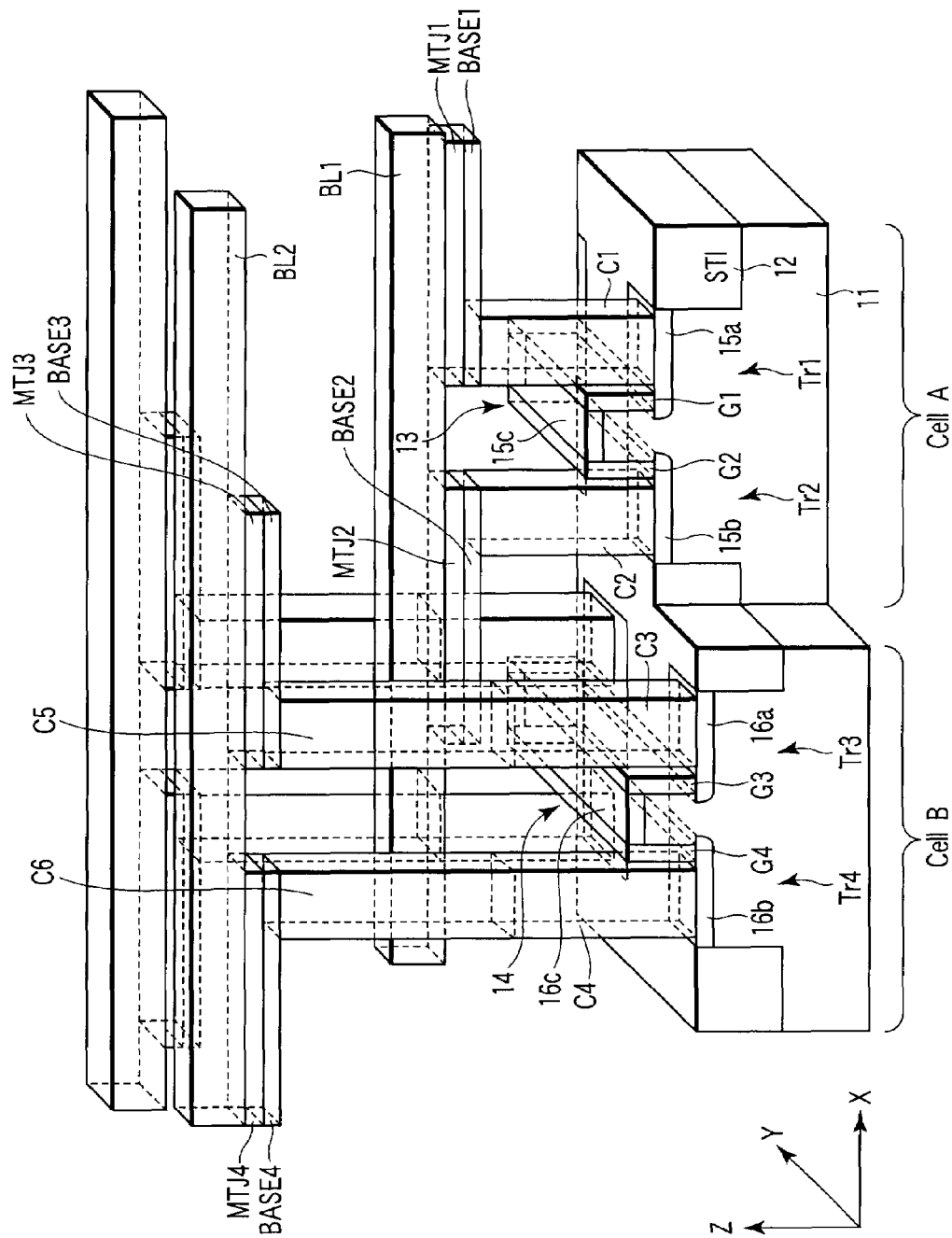
FIG. 17 is a perspective view showing a magnetic random access memory according to another embodiment of the present invention.

The write method of each embodiment performs a so-called magnetic field write that supplies a write current to the bit line and write word line, and applies a magnetic field generated by the write current to the MTJ element. However, the present invention is also applicable to a so-called spin injection write that supplies a write current perpendicularly to the film surface of the MTJ element, and reverses magnetization in the recording layer in accordance with the direction of the write current. In this case, as shown in FIG. 17, the write word lines WWL shown in FIG. 1 can be omitted, and the write current need only be supplied between the bit line and vertical transistor. In addition, this structure shown in FIG. 17 is also applicable to an RRAM (Resistive Random Access Memory) and PRAM (Phase change Random Access memory). The RRAM uses a storage element using the CER (Colossal Electro-Resistance) effect, instead of the MTJ element. The PRAM uses a storage element using a crystal phase change, instead of the MTJ element.

An SOI (Silicon On Insulator) substrate may also be used as the substrate in each embodiment. This SOI substrate comprises a semiconductor substrate, a semiconductor layer, and a buried insulating film formed between the semiconductor substrate and semiconductor layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a semiconductor substrate having a first projection projecting from a substrate surface, the first projection having an upper surface, a first side surface and a second side surface opposing each other;
    a first gate electrode formed on the first side surface of the first projection;
    a second gate electrode formed on the second side surface of the first projection;
    a first source diffusion layer formed in the upper surface of the first projection;
    a first drain diffusion layer formed in the substrate surface at a root on a side of the first side surface of the first projection;
    a second drain diffusion layer formed in the substrate surface at a root on a side of the second side surface of the first projection;
    a first word line formed above the semiconductor substrate;
    a second word line formed above the semiconductor substrate;
    a first bit line formed above the first word line and the second word line;
    a first magnetoresistive effect element formed between the first bit line and the first word line, and connected to the first bit line;
    a second magnetoresistive effect element formed between the first bit line and the second word line, and connected to the first bit line;
    a first contact which connects the first magnetoresistive effect element and the first drain diffusion layer; and
    a second contact which connects the second magnetoresistive effect element and the second drain diffusion layer.

2. The memory according to claim 1, in which the semiconductor substrate has a second projection projecting from the substrate surface, the second projection having an upper surface, a third side surface and a fourth side surface opposing each other and, and which further comprises:

a third gate electrode formed on the third side surface of the second projection;
a fourth gate electrode formed on the fourth side surface of the second projection;
a second source diffusion layer formed in the upper surface of the second projection;
a third drain diffusion layer formed in the substrate surface at a root on a side of the third side surface of the second projection;
a fourth drain diffusion layer formed in the substrate surface at a root on a side of the fourth side surface of the second projection;
a third word line formed above the first bit line, and overlapping the second word line on a different layer level;
a fourth word line formed above the first bit line;
a second bit line formed above the third word line and the fourth word line;
a third magnetoresistive effect element formed between the second bit line and the third word line, and connected to the second bit line;
a fourth magnetoresistive effect element formed between the second bit line and the fourth word line, and connected to the second bit line;
a third contact which connects the third magnetoresistive effect element and the third drain diffusion layer; and
a fourth contact which connects the fourth magnetoresistive effect element and the fourth drain diffusion layer.

3. The memory according to claim 2, wherein the second magnetoresistive effect element and the third magnetoresistive effect element are formed between the first projection and the second projection.

4. The memory according to claim 2, wherein when the memory is viewed from above, the second magnetoresistive effect element and the third magnetoresistive effect element do not overlap each other.

5. The memory according to claim 2, wherein the third magnetoresistive effect element and the fourth magnetoresistive effect element are formed on a layer level different from the first magnetoresistive effect element and the second magnetoresistive effect element.

6. The memory according to claim 2, wherein the second contact and the third contact sandwich the second word line.

7. The memory according to claim 1, wherein the first word line and the second word line are formed on the same layer level.

8. The memory according to claim 1, wherein the first magnetoresistive effect element and the second magnetoresistive effect element are formed on the same layer level.

9. The memory according to claim 1, wherein
an easy magnetization axis of the first magnetoresistive effect element and an easy magnetization axis of the second magnetoresistive effect element point in a direction in which the first bit line and the second bit line run, and
a hard magnetization axis of the first magnetoresistive effect element and a hard magnetization axis of the second magnetoresistive effect element point in a direction in which the first word line and the second word line run.

10. The memory according to claim 1, further comprising
a first lower electrode formed below the first magnetoresistive effect element, and having the same planar shape as the first magnetoresistive effect element, and
a second lower electrode formed below the second magnetoresistive effect element, and having the same planar shape as the second magnetoresistive effect element.

11. The memory according to claim 1, wherein a direction in which the first projection extends is the same as a direction in which the first word line and the second word line run.

12. The memory according to claim 1, which further comprises:
a first gate insulating film formed on the first drain diffusion layer;
a second gate insulating film formed on the second drain diffusion layer;
a third gate insulating film formed on the first source diffusion layer;
a fourth gate insulating film formed between the first gate electrode and the first side surface of the first projection; and
a fifth gate insulating film formed between the second gate electrode and the second side surface of the first projection, and
in which the first gate insulating film, the second gate insulating film, and the third gate insulating film are thicker than the fourth gate insulating film and the fifth gate insulating film.

13. The memory according to claim 12, wherein one continuous film forms the first gate insulating film, the second gate insulating film, the third gate insulating film, the fourth gate insulating film, and the fifth gate insulating film.

14. The memory according to claim 12, further comprising:
a first silicide film formed on the first drain diffusion layer;
a second silicide film formed on the second drain diffusion layer;
a third silicide film formed on the first source diffusion layer;
a fourth silicide film formed on the first gate electrode; and
a fifth silicide film formed on the second gate electrode.

15. The memory according to claim 1, further comprising a source contact formed on the first source diffusion layer at an end portion of a memory cell array region, and connected to a ground terminal.

16. The memory according to claim 1, wherein
the first projection has a first region positioned at one end portion of a memory cell array region, a second region positioned at the other end portion of the memory cell array region, and a third region positioned in a central portion of the memory cell array region, and
the first region and the second region are wider than the third region.

17. The memory according to claim 16, further comprising:
a first source contact formed in the first region and connected to the first source diffusion layer; and
a second source contact formed in the second region and connected to the first source diffusion layer.

18. The memory according to claim 16, wherein
the first region has a first recess,
the second region has a second recess,
the first gate electrode is buried in the first recess, and
the second gate electrode is buried in the second recess.

19. The memory according to claim 18, further comprising:
a first gate contact formed in the first recess and connected to the first gate electrode; and
a second gate contact formed in the second recess and connected to the second gate electrode.

20. The memory according to claim 1, wherein a width of the first projection is 70 nm (inclusive) to 120 nm (inclusive).

* * * * *